(12) United States Patent
Chiang

(10) Patent No.: US 6,587,942 B1
(45) Date of Patent: Jul. 1, 2003

(54) CIRCUIT FOR CONVERTING INPUT SERIAL DATA IN A PLURALITY OF POSSIBLE FORMATS INTO OUTPUT DATA IN PARALLEL FORMAT BY INTERPRETING INPUT DATA FORMAT INDICATION INFORMATION

(75) Inventor: Kevin Chiang, Fremont, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/476,580

(22) Filed: Jan. 3, 2000

(51) Int. Cl.[7] .............................................. G06F 13/00
(52) U.S. Cl. ............... 713/100; 713/1; 710/8; 710/11; 710/71
(58) Field of Search .................. 710/8, 11, 71; 713/1, 100

(56) References Cited

U.S. PATENT DOCUMENTS

| | | | | |
|---|---|---|---|---|
| 4,500,933 A | * | 2/1985 | Chan | 360/48 |
| 4,901,076 A | * | 2/1990 | Askin et al. | 341/100 |
| 4,972,470 A | * | 11/1990 | Farago | 310/71 |
| 5,594,442 A | * | 1/1997 | Paulos et al. | 341/143 |
| 6,038,400 A | * | 3/2000 | Bell et al. | 326/37 |
| 6,128,681 A | * | 10/2000 | Shephard | 710/38 |

\* cited by examiner

Primary Examiner—Thomas Lee
Assistant Examiner—Paul Yanchus
(74) Attorney, Agent, or Firm—Bobbie Truong; John Schipper

(57) ABSTRACT

A versatile serial to parallel interface capable of both receiving multiple types of input formats and operating in multiple operational modes includes a multiplexer, a signal generator, and a register. The multiplexer receives serial data from a plurality of possible data sources and, in response to a set of selection signals, outputs one of the sets of serial data to the signal generator. The signal generator thereafter forwards the serial data to the register for storage. In addition to forwarding the serial data to the register, the signal generator also generates clock and control signals. These signals are used to control the operation of the register to ensure proper serial to parallel conversion of the input serial data. In addition, these signals may also be provided to the source of the serial data to control the actions of the data source. The signal generator generates the clock and control signals in response to indication information provided to the signal generator. This indication information may include information relating to: (1) the desired mode of operation (e.g. slave or master) of the serial to parallel interface; and (2) the format (e.g. left justified or right justified) of the incoming serial data. This indication information gives the signal generator all of the information that it needs regarding the data source and the incoming data to generator all of the necessary signals for ensuring the proper operation of the serial to parallel interface.

20 Claims, 5 Drawing Sheets

CIRCUIT FOR CONVERTING INPUT SERIAL DATA IN A PLURALITY OF POSSIBLE FORMATS INTO OUTPUT DATA IN PARALLEL FORMAT BY INTERPRETING INPUT DATA FORMAT INDICATION INFORMATION

FIELD OF THE INVENTION

This invention relates generally to data processing mechanisms and more particularly to a serial-to-parallel interface capable of accepting multiple format types and operating in multiple modes.

BACKGROUND OF THE INVENTION

Serial to parallel converters are used in a wide variety of circuit implementations to convert streams of serial data into sets of parallel data. Once converted, the parallel data can be stored into memory, or processed by digital data processing mechanisms, such as microprocessors.

The process of converting serial data into parallel data is a relatively straightforward one. The conversion is typically achieved by storing the serial data a bit at a time into a shift register, and then when the shift register is full, outputting all of the stored bits simultaneously to provide a set of parallel data. While the conversion process itself is straightforward, the design of a serial to parallel converter can be fairly difficult. This difficulty stems largely from the fact that the input to a serial to parallel converter can be from many different sources having many different formats, with each source and format possibly having its own set of preferences and requirements. For example, some data sources may require the serial to parallel converter to operate in slave mode such that the converter receives its clock signals from the data source, while other data sources may require the converter to operate in master mode such that the converter provides the clock signals to the data source. Also, some formats may send the serial data in a left justified fashion such that the valid data starts at the beginning of a data cycle, while other formats may send the serial data in a right justified fashion such that the valid data begins appearing in the middle of a data cycle. Because of these and other possible variations in data sources and data formats, it is difficult to design a general purpose serial to parallel converter that will work with all input sources and formats.

Several approaches have been taken to address the data source and data format variation problem. One approach is to implement a separate serial to parallel converter for each possible variation. Another approach is to implement complex combinational logic to take into account all possible variations. Both of these approaches suffer from significant drawbacks. These drawbacks include inflexibility (whenever a source or format is altered or added, the implementation of the converter needs to be altered) and impracticability (these approaches require too much chip space to be practically implemented). With such significant drawbacks, neither of these approaches provides a satisfactory solution. Hence, an improved serial to parallel converting mechanism is needed.

SUMMARY OF THE INVENTION

The present invention provides a versatile serial to parallel interface capable of both receiving multiple types of input formats and operating in multiple operational modes. According to one embodiment, the serial to parallel interface of the present invention comprises a multiplexer, a signal generator, and a register. The multiplexer receives serial data from at least one of a plurality of possible data sources and, in response to a set of selection signals, outputs one of the sets of serial data to the signal generator. The signal generator thereafter forwards the serial data to the register for storage.

In addition to forwarding the serial data to the register, the signal generator also generates clock and control signals. These signals are used to control the operation of the register to ensure proper serial to parallel conversion of the input serial data. In addition, these signals may also be provided to the source of the serial data to control the actions of the data source. In accordance with the present invention, the signal generator generates the clock and control signals in response to indication information provided to the signal generator. In one embodiment, this indication information includes information relating to: (1) the desired mode of operation (e.g. slave or master) of the serial to parallel interface; and (2) the format (e.g. left justified or right justified) of the incoming serial data. This indication information gives the signal generator all of the information that it needs regarding the data source and the incoming data. Armed with this information, the signal generator can generate all of the necessary signals for ensuring the proper operation of the serial to parallel interface.

According to one embodiment, the indication information is provided to the signal generator by way of an indication register. The contents of the indication register may be established by an external component, such as a microprocessor. Since the contents of the indication register determine the behavior of the signal generator, and since the contents of the indication register may be set by an external component, the indication register in effect provides a mechanism for enabling an external component to dictate the behavior of the signal generator. By enabling an external component to dictate the signal generator's behavior, the present invention greatly simplifies the logic that needs to be implemented by the signal generator. Since the signal generator may be told what it needs to do, it need not implement complex logic to determine how it should be behave. Thus, the present invention provides the best of both worlds. Namely, it accommodates multiple input types and multiple operational modes without requiring complex circuitry. Hence, the present invention represents a significant improvement over the prior art.

DETAILED DESCRIPTION OF THE EMBODIMENT(S)

Figure 1:
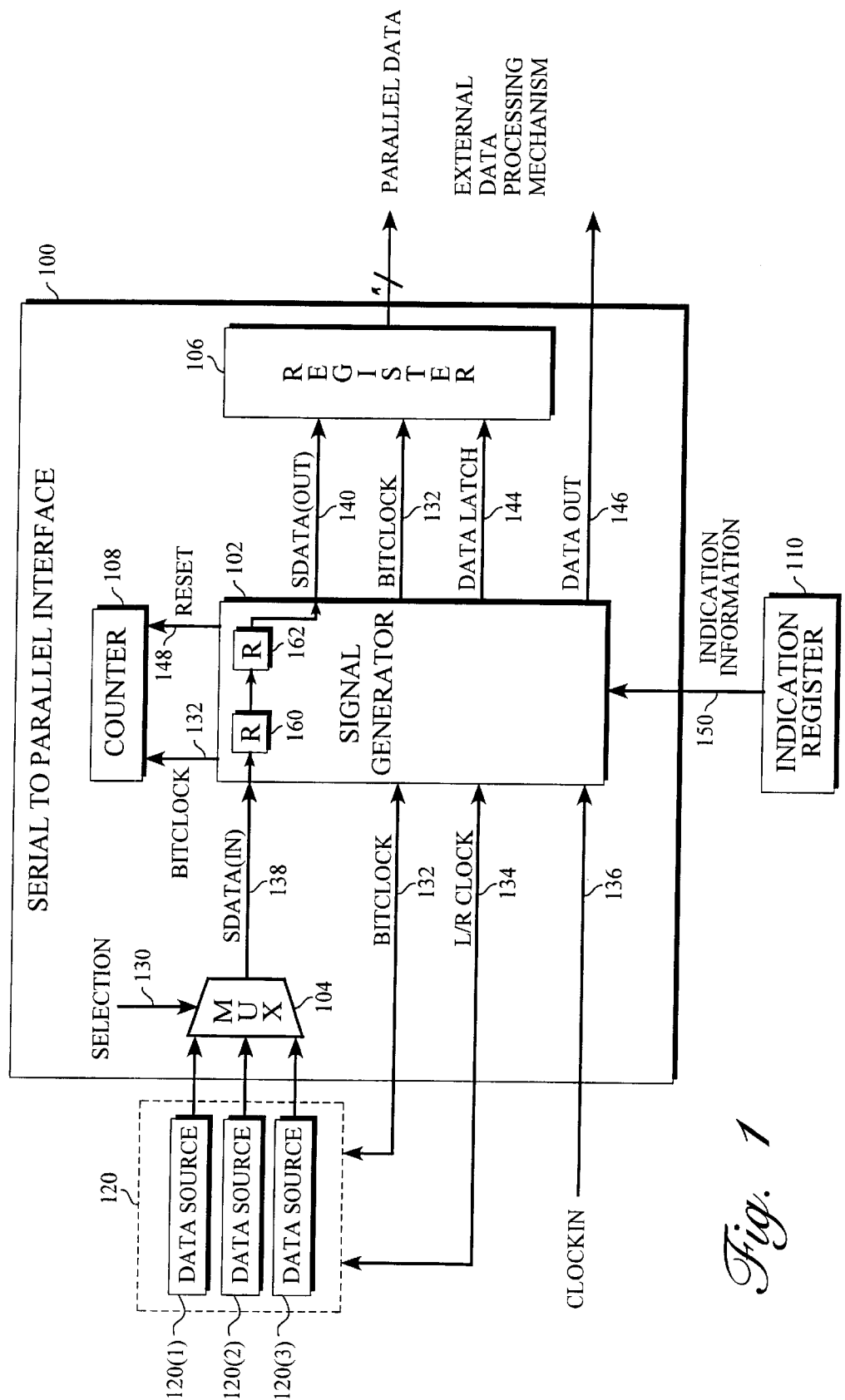
FIG. 1 is a block diagram of one possible embodiment of the serial to parallel interface of the present invention.

With reference to FIG. 1, there is shown a block diagram of one possible embodiment of the serial to parallel interface 100 of the present invention (hereinafter, interface 100). As shown, the interface 100 comprises a signal generator 102, a multiplexer 104, a register 106, and a counter 108. Together, these components operate to convert an input stream of serial data into an output set of parallel data which may be processed by an external data processing mechanism. For purposes of the present invention, the external data processing mechanism may be any mechanism capable of processing digital data, including but not limited to a memory and a microprocessor.

The input stream of serial data may come from one of a plurality of external data sources 120. For purposes of the present invention, the input serial data may have any desired digital format, and may come from any type of digital data source. For purposes of illustration, the input serial data will be assumed in the following discussion to be digital audio data coming from one of a variety of audio data sources. In such a case, the data source 120(1) may be an analog-to-digital converter which has converted an analog signal (such as that from a microphone) into a stream of serial digital data. The data source. 120(2) may be a digital signal input with an EBU interface, such as that found in various types of electronic equipment, and the data source 120(3) may be the audio output of a compact disk player. Each data source 120 may have its own set of operational preferences, and each set of serial data may have its own format. All of the sets of serial data are fed to the inputs of the multiplexer 104. In response to the selection signals 130 (more will be said about the selection signals 130 in a later section), the multiplexer 104 selects one of the sets of input serial data and passes it on to its output as Sdata(in) 138. Sdata(in) 138, which is fed to the signal generator 102, represents the input serial data to be converted into a set of parallel data.

In response to the input serial data Sdata(in) 138, the signal generator 102 coordinates the operation of the other components in the interface 100 to ensure that the input serial data Sdata(in) 138 is properly converted into a set of parallel output data. In one embodiment, the signal generator 102 is implemented as a set of hardwired combinational logic components. In performing the coordination function, the signal generator 102 generates and/or receives a number of different signals. One such signal is the ClockIn signal 136, which may come from any clock signal source. In one embodiment, the ClockIn signal 136 is received from an oscillating crystal (not shown). As described further in a later section, the ClockIn signal 136 is used by the signal generator 102 to generate several necessary clock and control signals.

The signal generator 102 may also receive or generate a BitClock signal 132 and a L/R Clock signal 134. Whether the signal generator 102 receives or provides these signals 132, 134 depends upon the mode in which the signal generator 102 is operating. If the signal generator 102 is operating in slave mode, these signals 132, 134 are provided to the signal generator 102 by the data source 120 providing the input serial data Sdata(in) 138. If the signal generator 102 is operating in master mode, then the signal generator 102 provides the signals 132, 134 to the data source 120 providing the input serial data Sdata(in) 138. More will be said about the signal generator's operational mode in a later section. In the embodiment shown, the BitClock signal 132 represents the clock signal used to drive or clock each bit of the input serial data Sdata(in) 138, while the L/R Clock signal 134 specifies to which channel the input serial data Sdata(in) 138 pertains. Since in the present example the data sources 120 are assumed to be audio data sources, it is necessary to specify to which audio channel (the left or the right channel) the input serial data pertains. The L/R Clock signal 134 performs this specification function. As will be discussed further below, the L/R Clock signal 134 also establishes the time period for a data cycle.

Figure 3:
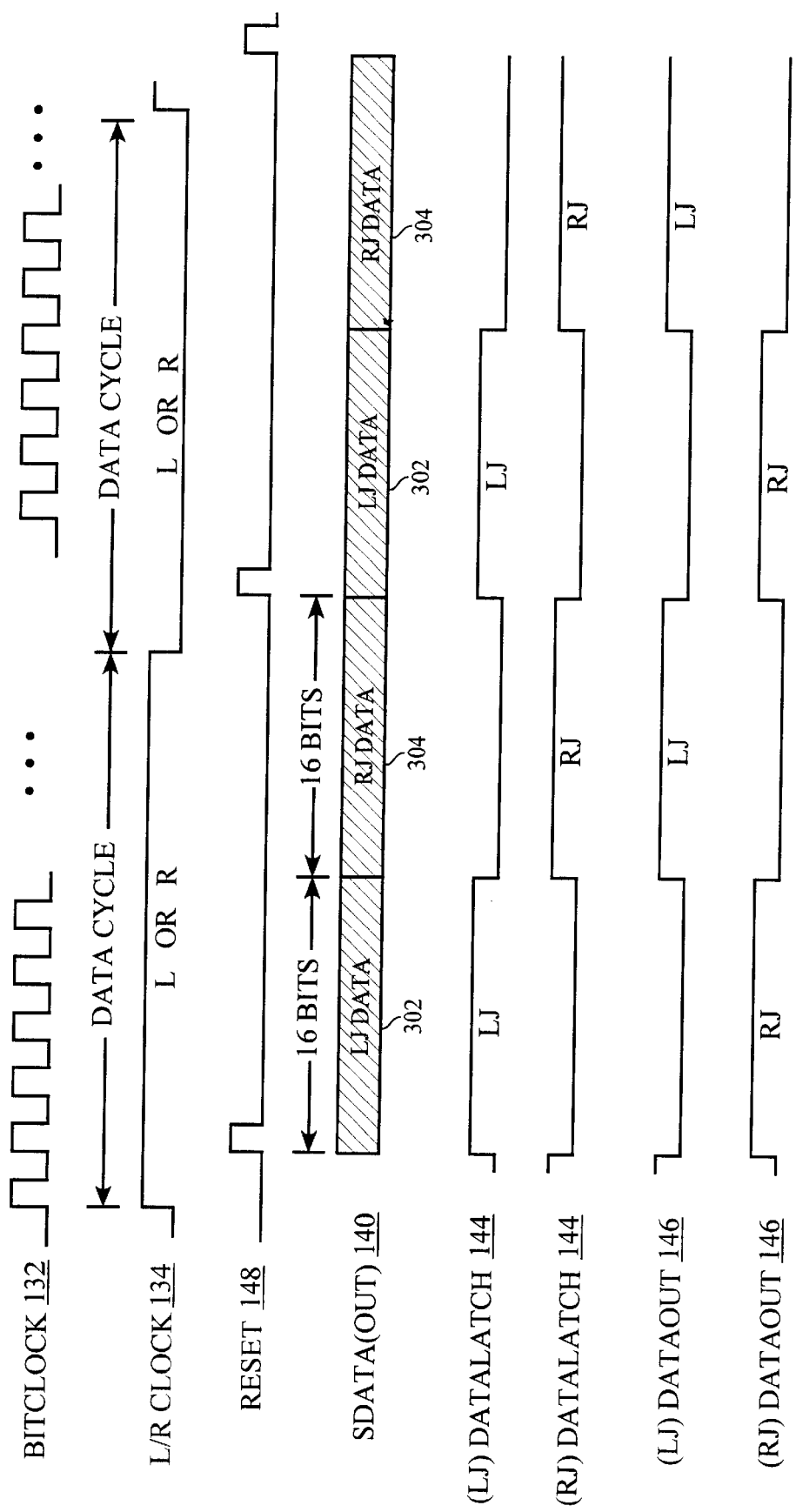
FIG. 3 is a timing diagram of the major signals received/generated by the interface of the present invention.

In addition to the signals discussed above, the signal generator 102 also provides a Reset signal 148, a DataLatch signal 144, a DataOut signal 146, and a Sdata(out) signal 140. The Reset signal 148 is provided to the counter 108 along with the BitClock signal 132, and is used by the signal generator 102 to selectively reset the counter 108. The DataLatch signal 144 is provided to the register 106 along with the BitClock signal 132, and is used by the signal generator 102 to control when data is written into the register 106. In one embodiment, when the DataLatch signal 144 is asserted, data is written into the register 106. When the DataLatch signal 144 is deasserted, no data is latched into the register 106. The Sdata(out) signal 140 represents the serial data that is to be written into the register 106 and converted into a set of parallel data. As shown in FIG. 3, the Sdata(out) signal 140 is derived by passing the Sdata(in) signal 138 through two 1-bit registers 160, 162. Register 160 is triggered on the rising edge of the BitClock 132, while register 162 is triggered on the falling edge of the BitClock 132. Thus, Sdata(out) 140 is a delayed version of Sdata(in) 138 with the delay being one full cycle of the BitClock 132. The DataOut signal 146 provides an indication to the external data processing mechanism as to when it is appropriate for the external mechanism to extract parallel data from the register 106. The DataOut signal 146 is asserted after the register 106 has been fully loaded with data, and it is safe for the external mechanism to read the data stored in the register 106. In one embodiment, the DataLatch signal 144 and the DataOut signal 146 are complementary signals. That is, when the DataLatch signal 144 is asserted, the DataOut signal 146 is deasserted, and when the DataLatch signal 144 is deasserted, the DataOut signal 146 is asserted. Together, these two signals 144, 146 control the writing and reading of data from the register 106.

In response to the Sdata(out) signal 140, the BitClock signal 132, and the DataLatch signal 144, the register 106 stores the input serial data 140 one bit at a time into its storage units, and then outputs the data from all of its storage units simultaneously as a set of parallel data. By doing so, the register 106 converts the input stream of serial data 140 into parallel data. For purposes of the present invention, register 106 may be any type of register capable of performing this conversion function, including but not limited to a shift register and a register/pointer combination having the ability to write a bit at a time into a specific storage location of the register 106.

As noted previously, the signal generator 102 is responsible for generating the clock and control signals needed to ensure the proper operation of the interface 100. According to the present invention, the signal generator 102 performs this coordination function in response to a set of indication information 150. The indication information 150 provides the signal generator 102 with all of the relevant information regarding the input data source 120 and the input data format. Given this specific information, the signal generator 102 can generate the signals needed to properly process a particular input data format from a particular data source.

In one embodiment, the indication information 150 is provided to the signal generator 102 by way of an indication register 110 which is programmable by an external mechanism, such as a microprocessor (not shown). Because the indication register 110 is accessible and programmable (i.e. writable) by the external mechanism, it provides a means for enabling the external mechanism to tell the signal generator 102 how a set of input data should be processed.

By enabling the external mechanism to tell the signal generator 102 how to process the input data, the present invention significantly simplifies the logic needed to implement the signal generator 102. No longer is the signal generator 102 required to determine the data format type and the operational requirements of the data source. Instead, this information is provided to the signal generator 102. As a result, the signal generator 102 is able to generate the necessary clock and control signals with much less logic. Hence, the present invention provides the best of both worlds. Namely, it has the versatility to accommodate multiple input types and multiple operational modes; however, it does not require complex circuitry to implement. Hence, the present invention represents a significant improvement over the prior art.

Figure 2:
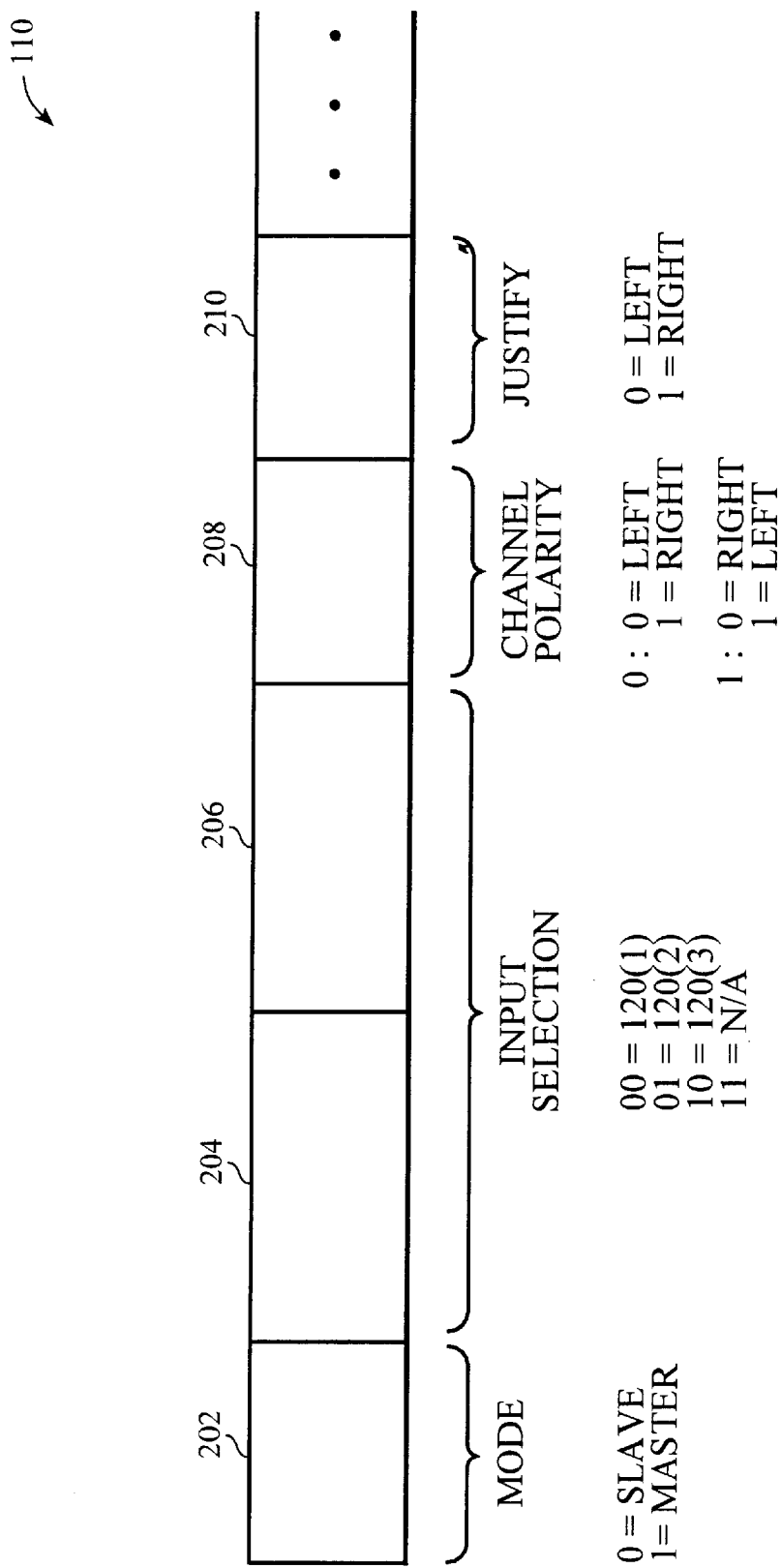
FIG. 2 is a diagram of one possible embodiment of the indication register used in conjunction with the interface of the present invention.

With reference to FIG. 2, there is shown one possible embodiment of the indication register 110, wherein the register 110 comprises a Mode bit 202, two Input Selection bits 204, 206, a Channel Polarity bit 208, and a Justify bit 210. The value of the Mode bit 202 indicates to the signal generator 102 the mode in which it should operate. In one embodiment, if the Mode bit 202 has a value of 0, then the signal generator 102 should operate in slave mode, which means that it should receive its clock signals from the input data source 120. On the other hand, if the Mode bit 202 has a value of 1, then the signal generator 102 should operate in master mode, which means that it should provide the clock signals to the input data source 120. As will be discussed further in a later section, the Mode bit 202 determines the manner in which the signal generator 102 generates some of its control signals.

The Input Selection bits 204, 206 specify from which input data source 120 input data should be accepted. The Input Selection bits 204, 206 are fed as the selection signals 130 (FIG. 1) to the multiplexer 104 to cause the multiplexer 104 to pass the proper set of input data to its output. In the embodiment shown in FIG. 1, there are three possible input data sources. Thus, if the Input Selection bits 204, 206 have a value of 00, then data source 120(1) will be selected by the multiplexer 104. If the Input Selection bits 204, 206 have a value of 01, then data source 120(2) will be selected, and if the Input Selection bits 204, 206 have a value of 10, then data source 120(3) will be selected. FIG. 2 shows only two Input Selection bits 204, 206 because only two bits are needed for three possible data sources. However, it should be noted that the number of selection bits may be increased to accommodate a higher number of potential data sources. For example, if there are eight possible data sources, then three Input Selection bits may be used. This and other modifications are within the scope of the present invention.

The Channel Polarity bit 208 is used to indicate the polarity of the L/R clock signal 134 (FIG. 1). In one embodiment, if the Channel Polarity bit 208 has a value of 0, then a low (i.e. a "0") in the L/R clock signal 134 will indicate that the incoming data pertains to the left channel, and a high (i.e. a "1") will indicate that the incoming data pertains to the right channel. On the other hand, if the Channel Polarity bit 208 has a value of 1, then a low (i.e. a "0") in the L/R clock signal 134 will indicate that the incoming data pertains to the right channel, and a high (i.e. a "1") will indicate that the incoming data pertains to the left channel. The Channel Polarity bit 208 is used by the signal generator 102 to generate the L/R clock signal 134 in master mode, as will be discussed in a later section.

The value of the Justify bit 210 indicates to the signal generator 102 the format in which the input serial data Sdata(in) 138 will be provided. In one embodiment, if the Justify bit 210 has a value of zero, then it means that the input serial data Sdata(in) 138 will be left justified, which means that valid data starts at the beginning of a data cycle. If the Justify bit 210 has a value of 1, then it means that Sdata(in) 138 will be right justified, which means that valid data begins appearing in the middle of a data cycle. As will be described further below, the information provided by the Justify bit 210 is used by the signal generator 102 in generating the DataLatch 144 and DataOut 146 signals (FIG. 1).

In the embodiment shown in FIG. 2, the indication register 110 comprises the information described above. It should be noted though that if so desired, the indication register 110 may be expanded to comprise additional bits for storing additional information. This additional information may provide further specifics as to the operational preferences of the data sources and the formats of the input data. If provided, this additional information may be used by the signal generator 102 in generating the necessary clock and control signals. Such modifications and enhancements are within the scope of the present invention.

With reference to FIG. 3, there is shown a timing diagram showing the relationships among the major signals generated/received by the interface 100. These major signals include the BitClock 132, the L/R Clock 134, the Reset signal 148, the Sdata(out) signal 140, the DataLatch signal 144, and the DataOut signal 146. As noted previously, the BitClock 132 is the clock signal used to clock each bit of the input serial data. In master mode, the BitClock 132 is generated by the signal generator 102 and provided to the input data source 120. In slave mode, the BitClock 132 is provided to the signal generator 102 by the input data source 120.

The L/R Clock 134 is the signal used to specify whether a set of input serial data pertains to a left audio channel or a right audio channel. In the embodiment shown in FIG. 3, the L/R Clock 134 is high (i.e. asserted) while data pertaining to the left channel is provided, and low while data pertaining to the right channel is provided. The L/R Clock 134 may also be of the opposite polarity, if so desired. In such a case, the L/R Clock 134 is low while data pertaining to the left channel is provided, and high while data pertaining to the right channel is provided. In addition to specifying the pertinent channel, the L/R Clock 134 also serves to establish the data cycles during which data may be received. In one embodiment, each half cycle of the L/R Clock 134 is thirty-two BitClock cycles long, so that up to thirty-two bits of data may be clocked in for each half cycle of the L/R Clock 134. Thus, during the half cycle corresponding to the left channel, up to thirty-two bits of data may be clocked, and during the half cycle corresponding to the right channel, up to thirty-two bits of data may be clocked. Each half cycle of the L/R Clock 134 will be referred to herein as a data cycle. In master mode, the L/R Clock 134 is generated by the signal generator 102 and provided to the input data source 120. In slave mode, the L/R Clock 134 is provided to the signal generator 102 by the input data source 120.

Regardless of the operational mode of the interface 100, the Reset signal 148 is generated by the signal generator 102. As will be described in a later section, the manner in which the Reset signal 148 is generated will depend upon the operational mode; however, the fact that the Reset signal 148 is generated by the signal generator 102 does not change. As noted previously, the Reset signal 148 is used by the signal generator 102 to reset the counter 108 (FIG. 1). As shown in FIG. 3, the Reset signal 148 comprises a plurality of short-duration pulses. Each pulse occurs one full BitClock 132 cycle after a transition (falling edge or rising edge transition) of the L/R Clock 134. This full BitClock 132 cycle delay is imposed to accommodate the Sdata(out) signal 140, since Sdata(out) 140 is one full BitClock 132 cycle delayed relative to Sdata(in) 138 and L/R Clock 134.

Thus, Reset signal 148 is synchronized with Sdata(out) 140. By providing a pulse at the beginning of each cycle of Sdata(out) 140, the Reset signal 148 resets the counter 108 at the beginning of each Sdata(out) 140 data cycle. The resetting of the counter 108 serves to synchronize the operation of all of the components.

The serial data signal Sdata(out) 140 provided by the signal generator 102 represents the serial data that is to be converted by the register 106 (FIG. 1) into a set of parallel data. As mentioned previously, Sdata(out) 140 is a delayed version of Sdata(in) 138. In one embodiment, Sdata(out) 140 contains valid data for only half of a data cycle. Since in the present example a data cycle is thirty-two bits long, Sdata (out) 140 contains sixteen bits of valid data for each data cycle. If Sdata(out) 140 is in left justified format, then the valid data (LJ Data 302) will appear at the beginning half of the data cycle, as shown, and if Sdata(out) 140 is in right justified format, then the valid data (RJ Data 304) will appear at the ending half of the data cycle. Since valid serial data is clocked in to the register 106 (FIG. 1) for only a portion of a data cycle, it leaves the remainder of the data cycle open for reading parallel data from the register 106. Thus, by having valid data for only a portion of a data cycle, it makes it possible to both clock in serial data to the register 106 (FIG. 1) and to read parallel data from the register 106 in the same data cycle (Note: this is true for left justified data; however, for right justified data, data is latched into the register 106 in one data cycle and read from the register 106 in the next data cycle).

The DataLatch signal 144 controls when data is latched into the register 106. In one embodiment, data is latched into the register 106 only when the DataLatch signal 144 is asserted. Since the. DataLatch signal 144 controls the latching of data into the register 106, the timing of the assertion of the DataLatch signal 144 coincides with the timing of the valid data. In order to achieve this coincidence of timing, the signal generator 102 determines the format of the serial data Sdata(out) 140 (e.g. whether the serial data is right or left justified). This information is supplied to the signal generator 102 by way of the Justify bit 210 (FIG. 2). If the Justify bit 210 indicates that the serial data Sdata(out) 140 is left justified, then the DataLatch signal 144 will be asserted during the first half of the data cycle (as shown by the LJ DataLatch signal 144 of FIG. 3). If the Justify bit 210 indicates that the serial data Sdata(out) 140 is right justified, then the DataLatch signal 144 will be asserted during the ending half of the data cycle (as shown by the RJ DataLatch signal 144 of FIG. 3). In one embodiment, the signal generator 102 generates the DataLatch signal 144 based upon the value of the Justify bit 210 and the value of the counter 108 (FIG. 1). Specifically, in the present example, each data cycle is thirty-two BitClock cycles long; thus, the counter 108 has a counting range of zero to at least thirty-one. If the serial data Sdata(out) 140 is left justified, then the DataLatch signal 144 will be asserted when the value of the counter 108 is between zero and fifteen, inclusive. If the serial data Sdata(out) 140 is right justified, then the Data-Latch signal 144 will be asserted when the value of the counter 108 is between sixteen and thirty-one, inclusive. In this manner, the signal generator 102 properly generates the DataLatch signal 144 needed to clock data into the register 106.

The DataOut signal 146 controls the reading out of parallel data from the register 108. The DataOut signal 146 is asserted when the register 108 is fully loaded with data, and it is safe for an external data processing mechanism to read parallel data from the register 108. In one embodiment, the DataOut signal 146 is asserted when the DataLatch signal 144 is deasserted; that is, the DataOut signal 146 is complementary to the DataLatch signal 144. This makes sense since data should not be read out of the register 108 until the register 108 is fully loaded. In one embodiment, the DataOut signal 146 is generated by the signal generator 102 based upon the value of the Justify bit 210 and the value of the counter 108. Specifically, in the present example, if the Justify bit 210 indicates that the serial data Sdata(out) 140 is left justified, then the DataOut signal 146 will be asserted when the value of the counter 108 is between sixteen and thirty-one, inclusive (as shown by the LJ DataOut signal 146 of FIG. 3). On the other hand, if the Justify bit 210 indicates that the serial data Sdata(out) 140 is right justified, then the DataOut signal 146 will be asserted when the value of the counter 108 is between zero and fifteen, inclusive (as shown by the RJ DataOut signal 146 of FIG. 3). In this manner, the DataOut signal 146 is generated by the signal generator 102.

Thus far, the L/R Clock 134 has been described as having data cycles of constant duration (e.g. 32 bits). While this is usually the case, it should be noted that under certain circumstances, it may be necessary or desirable to maintain a particular data cycle for longer or shorter than a particular duration (e.g. 32 bits). For example, if for some reason the register 106 is not yet ready to receive a new set of data, it may be necessary to lengthen a particular data cycle to wait for the register 106 to become ready. Such variable length data cycles can be accommodated by the present invention. To facilitate such circumstances, a higher count counter 108 may be used so that a counting range greater than 32 can be maintained.

Figure 4:
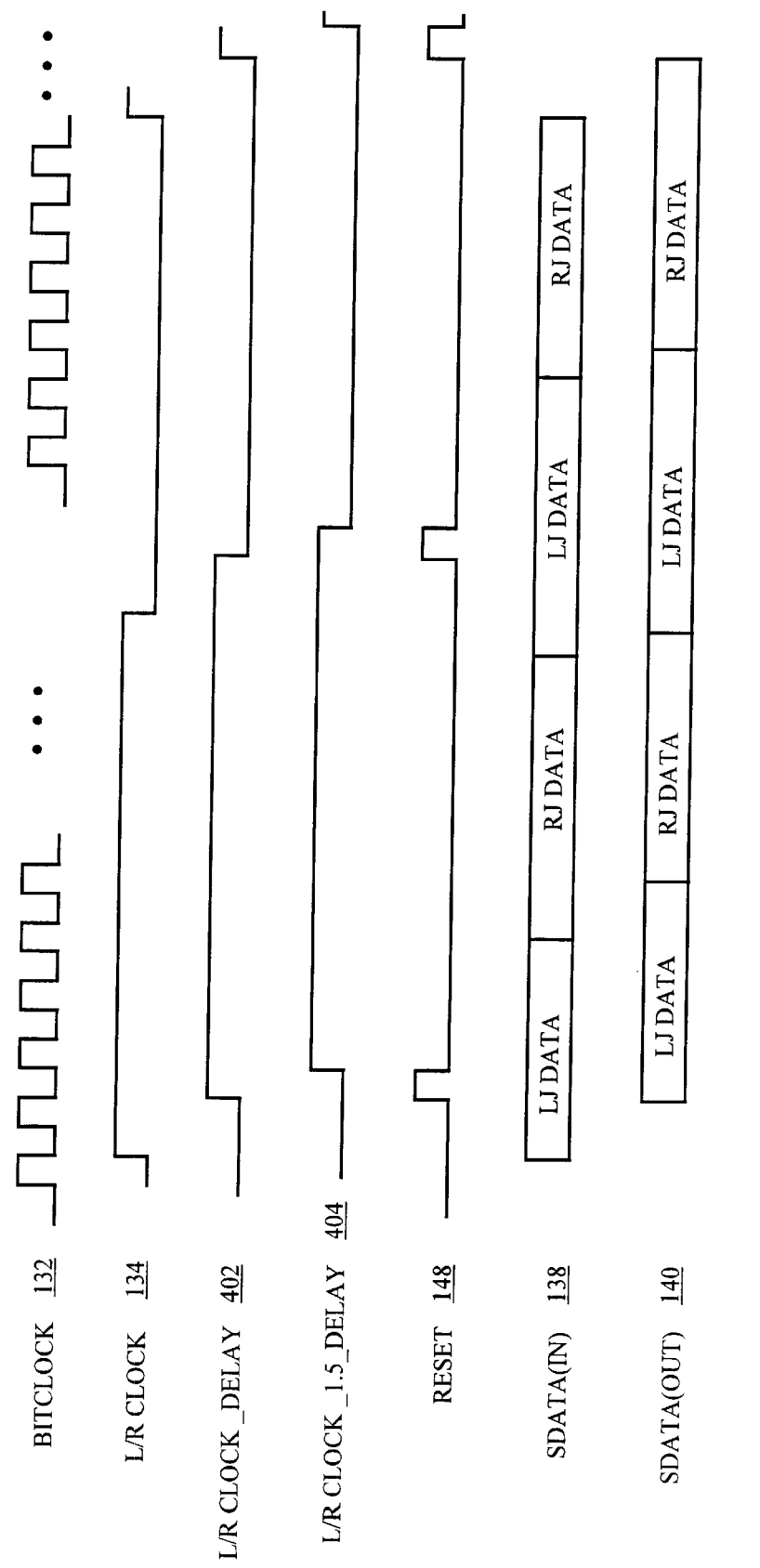
FIG. 4 is a timing diagram of several major signals received/generated in slave mode.
Figure 5:
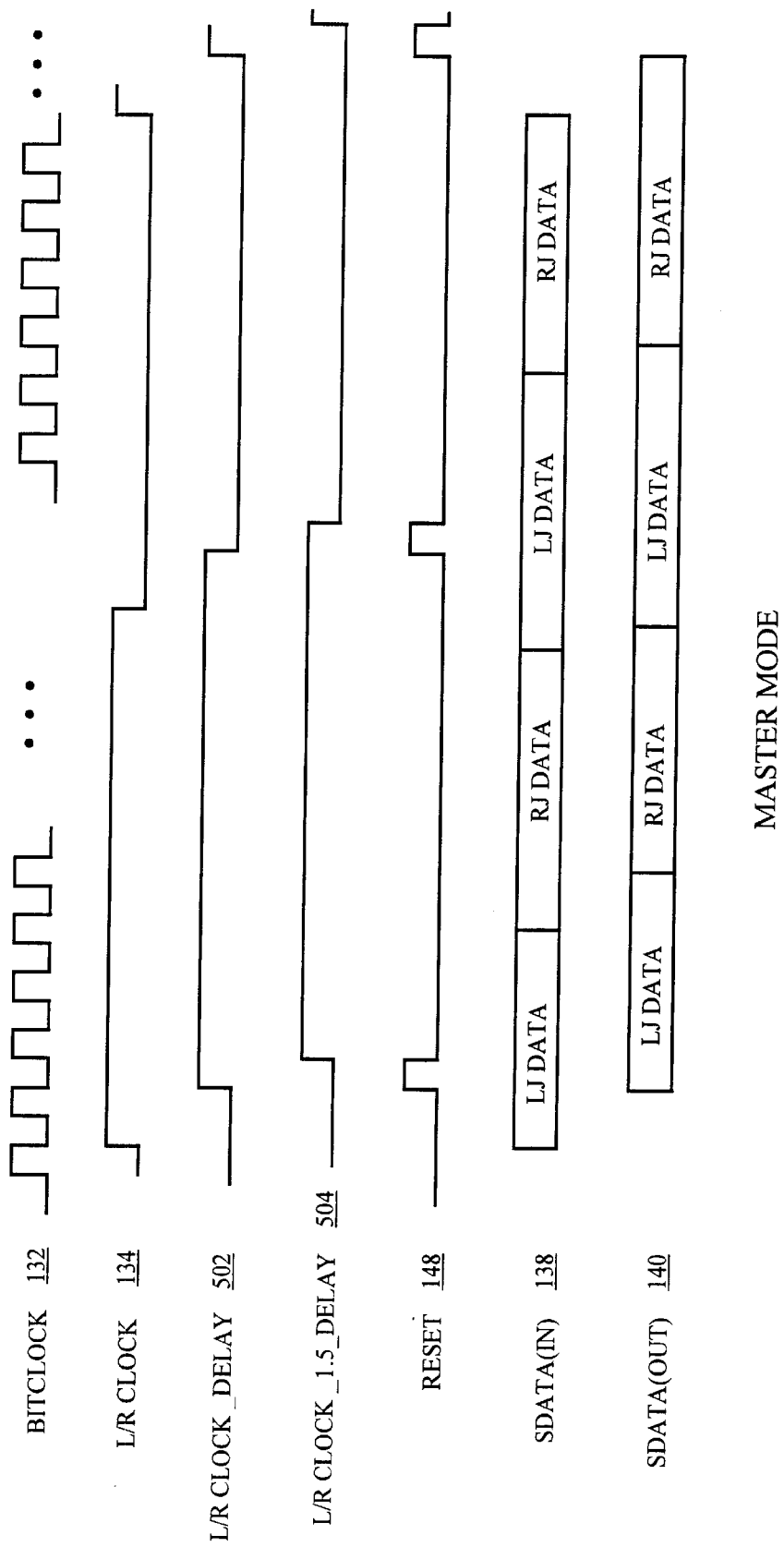
FIG. 5 is a timing diagram of several major signals received/generated in master mode.

As mentioned above, the reception/generation of some of the signals in FIG. 3 depend upon the operational mode of the interface 100. With reference to FIGS. 4 and 5, this will be discussed in greater detail. Referring first to FIG. 4, there is shown a timing diagram for several of the clock/control signals when the interface 100 is operating in slave mode. In slave mode, the BitClock signal 132 and the L/R clock signal 134 are provided to the signal generator 102 by the data source 102 providing the input serial data Sdata(in) 138; thus, the signal generator 102 simply receives these signals 132, 134. Given the LIR clock signal 134, the signal generator 102 generates two signals: (1) the L/R clock_Delay signal 402, which is a delayed, version of the L/R clock signal 134, delayed by one BitClock cycle; and (2) the L/R clock_1.5_Delay signal 404, which is a delayed version of the LIR clock signal 134, delayed by one and a half BitClock cycles. Based upon the L/R clock_Delay signal 402 and the L/R clock_1.5_Delay signal 404, the signal generator 102 generates the Reset signal 148. Specifically, the Reset signal 148 is generated by performing an XOR operation on the signals 402 and 404. Notice that the pulses of the Reset signal 148 are synchronized with the data cycles of the L/R clock_Delay signal 402. Thus, it is the L/R clock_Delay signal 402 (not the L/R clock signal 134) that is used to establish the data cycles in slave mode. In the manner described, the appropriate signals are derived and generated.

Referring now to FIG. 5, there is shown a timing diagram for several of the clock/control signals when the interface 100 is operating in master mode. In master mode, the BitClock signal 132 and the L/R clock signal 134 are generated by the signal generator 102 and provided to the data source 102 providing the input serial data Sdata(in) 138. In one embodiment, to generate the BitClock signal 132, the signal generator 102 divides the ClockIn signal 136 (FIG. 1) by a factor of 256. To generate the L/R clock signal 134, the signal generator 102 divides the BitClock signal 132 by a factor of 64. The polarity of the L/R clock signal 134 is determined by the value of the Channel Polarity bit 208 (FIG. 2) in the indication register 110. Based upon the L/R clock signal 134, the signal generator 102 generates two other signals: (1) the L/R clock_Delay signal 502, which is a delayed version of the L/R clock signal 134, delayed by one BitClock cycle; and (2) the L/R clock_1.5_Delay signal 504, which is a delayed version of the L/R clock signal 134, delayed by one and a half BitClock cycles. Based upon the L/R clock_Delay signal 502 and the L/R clock_1.5_Delay signal 504, the signal generator 102 generates the Reset signal 148. Specifically, the Reset signal 148 is generated by performing an XOR operation on the signals 502 and 504. Notice that the pulses of the Reset signal 148 are synchronized with the data cycles of the L/R clock_Delay signal 502. Thus, as was the case in slave mode, the L/R clock_Delay signal 502 (not the L/R clock signal 134) is used to establish the data cycles in master mode. In the manner described, the appropriate signals are derived and generated. Once derived, the clock/control signals are used to control the overall operation of the interface 100.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the appended claims.

What is claimed is:

1. A serial to parallel interface, comprising:
    an input port for receiving at least one set of serial data from at least one data source, and providing a set of input serial data, the input serial data having one of a plurality of possible formats;
    a register having an input terminal for receiving the set of input serial data, and an output terminal, the register converting the set of input serial data into a set of parallel data, and providing the set of parallel data at an output terminal; and
    a signal generator coupled to.receive a set of indication information, the indication information comprising information indicating a desired operational mode and a format for the input serial data the signal generator generating coordination signals based upon the indication information, at least a subset of the coordination signals being applied to the register to control the operation of the register to enable the register to properly convert the set of input serial data into the set of parallel data,
    wherein a data cycle of data processed by the register includes mutually exclusive first and second data half-cycles, each half-cycle having a selected length of L bits, where the first data half-cycle receives the input serial data in a first time interval contemporaneous with a second time interval during which output data are read out of the register from the second half-cycle.

2. The interface of claim 1, wherein said set of indication information is provided to said signal generator by a component external to said interface.

3. The interface of claim 1, wherein said set of indication information is received from an indication register, and wherein said indication information within the indication register is modifiable by a component external to said interface.

4. The interface of claim 1, wherein said subset of coordination signals comprises a latch control signal for controlling the storage of said input serial data into said register.

5. The interface of claim 4, wherein said latch control signal is generated based, at least partially, upon said format of said input serial data.

6. The interface of claim 4, wherein said interface further comprises a counter, and wherein said latch control signal is generated based, at least partially, upon said format of said input serial data and upon a current value of the counter.

7. The interface of claim 1, wherein said set of coordination signals comprises a data output control signal for indicating to an external data processing mechanism when parallel data may be read from said register.

8. The interface of claim 7, wherein said data output control signal is generated based, at least partially, upon said format of said input serial data.

9. The interface of claim 7, wherein said interface further comprises a counter, and wherein said data output control signal is generated based, at least partially, upon the format of said input serial data and upon a current value of the counter.

10. The interface of claim 1, wherein said subset of coordination signals comprises a latch control signal for controlling the storage of said input serial data into said register and further comprises a data output control signal for indicating to an external data processing mechanism when said parallel data may be read from said register.

11. The interface of claim 10, wherein said latch control signal and said data output control signal are complementary.

12. The interface of claim 10, wherein said latch control and said data output control signal are generated based, at least partially, upon said format of said input serial data.

13. The interface of claim 1, wherein said signal generator determines, based upon said indication information, whether a master mode of operation is desired, and if so, said signal generator generates one or more clock signals and provides at least a subset of the one or more clock signals to said data source.

14. The interface of claim 13, wherein said signal generator provides at least a subset of said one or more clock signals to said register.

15. The interface of claim 14, wherein said interface further comprises a counter, wherein said set of coordination signals comprises a reset control signal for resetting the counter, and wherein the reset control signal is generated based at least partially upon said one or more clock signals.

16. The interface claim 1, wherein said signal generator determines based upon said indication information whether a slave mode of operation is desired, and if so, said signal generator receives one or more clock signals from said data source and provides at least a subset of the one or more clock signals to said register.

17. The interface of claim 16, wherein said interface further comprises a counter, wherein said set of coordination signals comprises a reset control signal for resetting the counter, and wherein the reset control signal is generated based at least partially upon said one or more clock signals.

18. The interface of claim 1, wherein said interface further comprises a counter, and wherein said set of coordination signals comprises a reset signal for resetting the counter.

19. The interface of claim 1, wherein said input port comprises:
    a multiplexer having a plurality of input terminals for receiving a plurality of sets of serial data from a plurality of data sources, and an output terminal, the multiplexer selectively providing at the output terminal one of the plurality of sets of serial data.

20. The interface of claim 19, wherein said indication information comprises selection information, and wherein said multiplexer selects said one of said plurality of sets of serial data based upon the selection information.

* * * * *